(12) United States Patent
Gamliel

(10) Patent No.: US 6,943,646 B2
(45) Date of Patent: Sep. 13, 2005

(54) ISOLATION OF MINIATURE FILTERS

(76) Inventor: Doron Gamliel, Remez Street 1A, Kiriat-Ata, 28086 (IL)

( * ) Notice: Subject to any disclaimer, the term of this patent is extended or adjusted under 35 U.S.C. 154(b) by 0 days.

(21) Appl. No.: 10/712,517

(22) Filed: Nov. 14, 2003

(65) Prior Publication Data

US 2005/0104691 A1 May 19, 2005

(51) Int. Cl.$^7$ .............................. H03H 7/01; H01G 4/12
(52) U.S. Cl. ..................................... 333/185; 361/321.2
(58) Field of Search ................................ 333/174–176, 333/181, 184, 185, 204; 361/321.2, 330

(56) References Cited

U.S. PATENT DOCUMENTS

| 5,412,357 | A | * | 5/1995 | Nakamura et al. | 333/181 |
| 5,420,553 | A | * | 5/1995 | Sakamoto et al. | 333/172 |
| 5,519,366 | A | * | 5/1996 | Kaneko et al. | 333/204 |
| 6,504,452 | B2 | * | 1/2003 | Takada et al. | 333/185 |
| 6,529,101 | B2 | * | 3/2003 | Tojyo et al. | 333/175 |
| 6,765,458 | B2 | * | 7/2004 | Yamaguchi | 333/175 |
| 2002/0030563 | A1 | * | 3/2002 | Nosaka et al. | 333/185 |

FOREIGN PATENT DOCUMENTS

| JP | 07288441 A | * | 10/1995 | .......... H03H/7/075 |
| JP | 08046469 A | * | 2/1996 | ............ H03H/7/01 |
| JP | 09055335 A | * | 2/1997 | ............ H01G/4/35 |
| JP | 2000124068 A | * | 4/2000 | ............ H01G/4/40 |

* cited by examiner

Primary Examiner—Seungsook Ham
(74) Attorney, Agent, or Firm—Kevin Redmond

(57) ABSTRACT

A filter for filtering electronic signals that has improved isolation. The filter has a multi-layered dielectric block that has six surfaces. The block has a center portion. An input terminal is located on one side surface and has a portion extending onto the adjacent side surfaces toward the center portion. An output terminal is located on another side surface and has a portion extending onto the adjacent side surfaces toward the center portion. A pair of ground terminals are located on two other side surfaces at the center portion. A partial ground plane is located within the dielectric block. The ground plane extends from the center portion toward but not to the input and output terminal portions. The partial ground plane improves isolation of the filter.

4 Claims, 14 Drawing Sheets

ISOLATION OF MINIATURE FILTERS

BACKGROUND

1. Field of the Invention

This invention relates to electronic signal filters in general and more particularly to a signal filter that has improved isolation between input and output terminals.

2. Description of Related Art

Electrical filters are utilized to transmit desired electrical signals by passing or rejecting selected frequency bands. Filters may generally be grouped as lowpass, highpass, bandpass and bandstop filters depending on their characteristics. A lowpass filter passes low frequency electrical signals and rejects high frequency electrical signals. Conversely, a highpass filter suppresses low frequency electrical signals, while passing high frequency signals. A bandpass filter passes electrical signals in a particular frequency band between two frequency points such as a high and low frequency point. A bandstop filter, however, passes all signals except the signals having frequencies between two selected frequency points.

The performance of a filter can be measured using a network analyzer or may be simulated using computer simulation software. Scattering or S-parameter measurements are used to characterize the isolation of the filter. Scattering parameters are a ratio between the incident, reflected and transmitted waves. Typical S-parameter measurements include S11 and S21 measurements. S11 is defined as the measured reflected signal from the device under test. S21 is defined as the measured transmitted signal that passes through the device under test.

When designing very small filters for use at high frequencies, isolating the input port from the output port is a problem because of the small size of the filter. Current filter designs suffer from poor isolation between input and output ports that limit the performance of the filter.

While various types of electronic filters have been previously been used, they have suffered from poor isolation between the input and output terminals.

A current unmet need exists for an electronic filter with improved isolation and a small package size that can be produced at a low cost.

SUMMARY

It is a feature of the invention to provide a filter for filtering electronic signals that has improved isolation.

Another feature of the invention is to provide a filter for filtering an electronic signal that includes a multi-layered dielectric block that has six surfaces. The block has a center portion. A first terminal is located on a first side surface and has a first portion extending onto the adjacent side surfaces toward the center portion. A second terminal is located on a second side surface and has a second portion extending onto the adjacent side surfaces toward the center portion. A third terminal is located on a third side surface at the center portion. A fourth terminal is located on the fourth side surface at the center portion. A ground plane is located within the dielectric block. The ground plane is connected to the third and fourth terminals. The ground plane extends from the center portion toward but not to the first and second terminals. The partial ground plane improves isolation of the filter.

BRIEF DESCRIPTION OF THE DRAWINGS

It is noted that the drawings of the invention are not to scale. In the drawings, like numbering represents like elements between the drawings.

DETAILED DESCRIPTION

Figure 1:
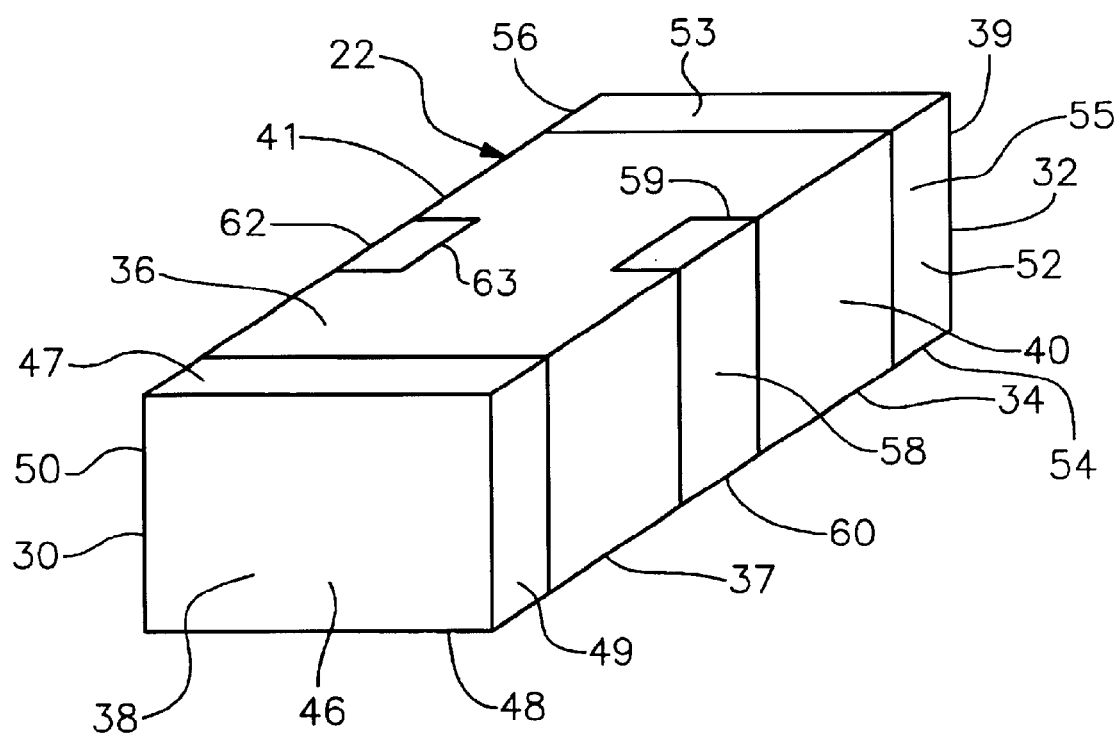
FIG. 1 is a perspective view of a miniature filter in accordance with the present invention.
Figure 2:
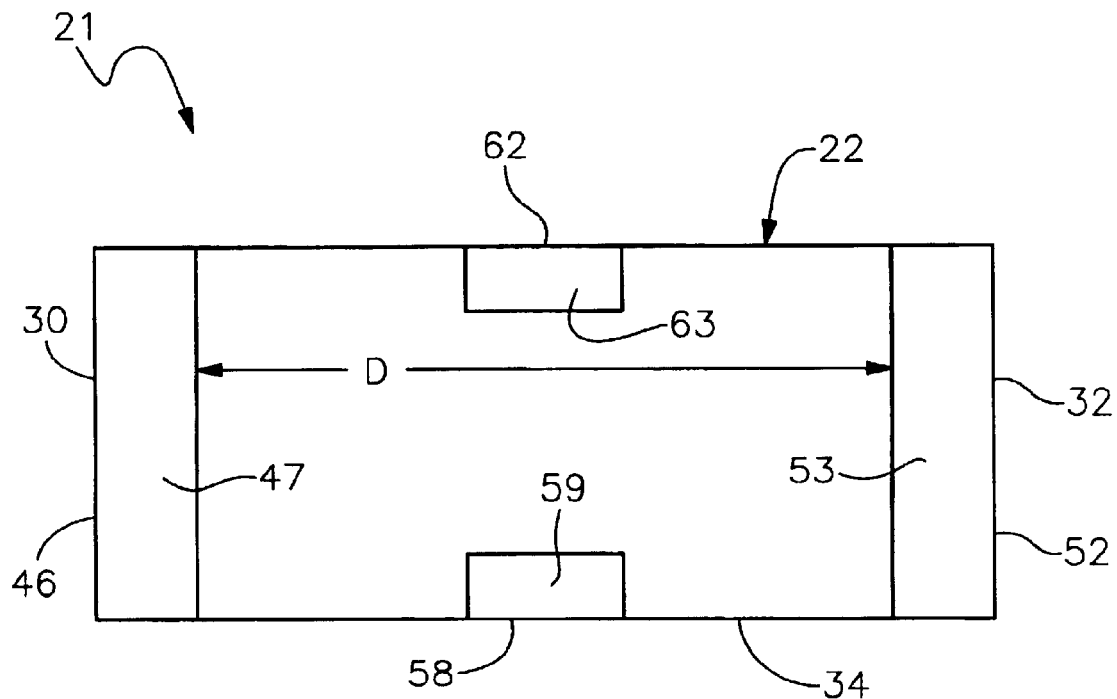
FIG. 2 is a top view of a FIG. 1.
Figure 3:
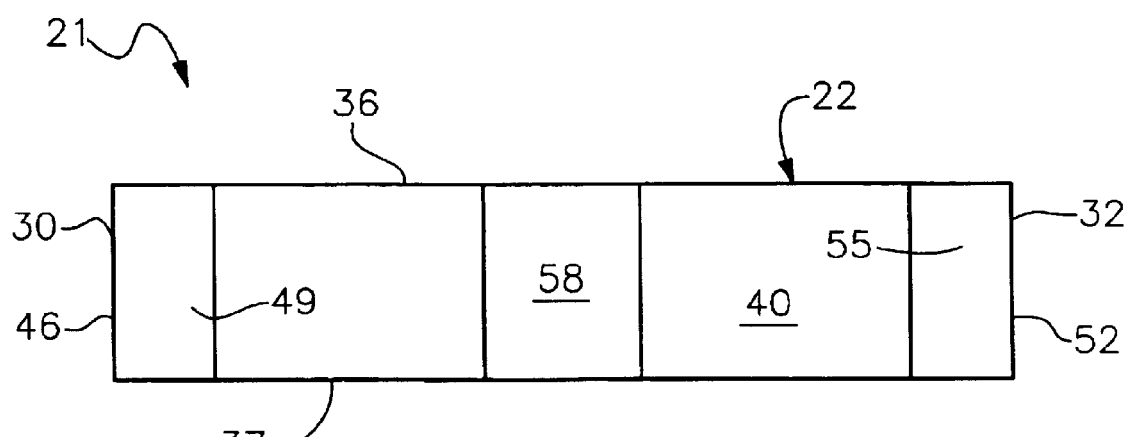
FIG. 3 is a side view of FIG. 1.

Referring to FIGS. 1–5, a ceramic miniature filter 21 for filtering an electronic signal is shown. Filter 21 has a multi-layered dielectric block 22 formed from three layers of ceramic material. Layers 24, 26 and 28 are stacked on top of each other to form block 22. Block 22 can be formed from conventional high temperature ceramic materials or from low temperature co-fired ceramic materials. Block 22 has ends 30 and 32 and a center portion 34. Block 22 has six outer surfaces including a top surface 36, bottom surface 37 and six side surfaces 38, 39, 40 and 41. Top and bottom surfaces 36 and 37 are substantially parallel and located on opposing sides of block 22. Similarly, sides 38 and 39 are parallel as are sides 40 and 41.

A metal input terminal 46 completely covers side surface 38. Terminal 46 has terminal portions 47, 48, 49 and 50 that wrap around and extend onto the adjacent surfaces toward the center portion 34. Terminal portion 47 extends onto top surface 36. Terminal portion 48 extends onto bottom surface 37. Terminal portion 49 extends onto side surface 40. Terminal portion 50 extends onto side surface 41.

Metal output terminal 52 completely covers side surface 39. Terminal 52 has terminal portions 53, 54, 55 and 56 that wrap around and extend onto the adjacent surfaces toward the center portion 34. Terminal portion 53 extends onto top surface 36. Terminal portion 54 extends onto bottom surface 37. Terminal portion 55 extends onto side surface 40. Terminal portion 56 extends onto side surface 41. The length between terminal portions 47 and 53 is defined as distance D.

Metal terminal 58 is located on side surface 40 at center portion 34. Terminal 58 has terminal portions 59 and 60 that wrap around and extend onto the adjacent surfaces. Terminal portion 59 extends onto top surface 36. Terminal portion 60 extends onto bottom surface 37.

Metal terminal 62 is located on side surface 41 at center portion 34. Terminal 62 has terminal portions 63 and 64 that wrap around and extend onto the adjacent surfaces. Terminal portion 63 extends onto top surface 36. Terminal portion 64 extends onto bottom surface 37. The metal terminals are used to electrically connect the filter to an external electronic circuit. The metal terminals would typically be soldered to a printed circuit board.

Figure 5:
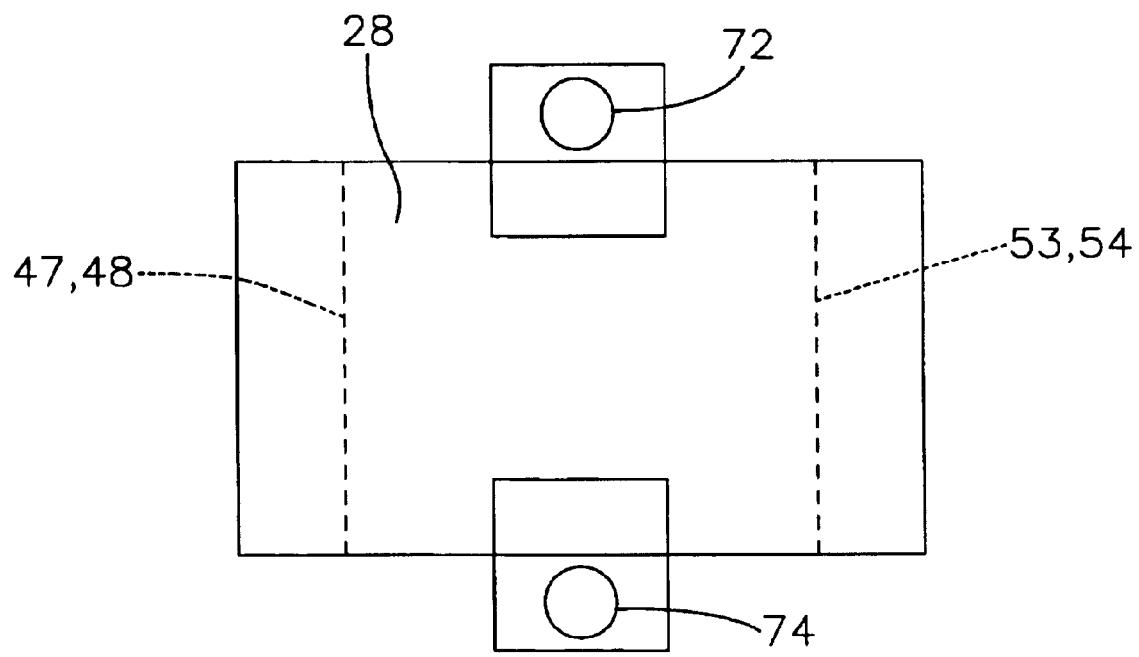
FIG. 5 is a top view of the bottom dielectric layer of FIG. 4.

Layers 24, 26 and 28 are stacked on top of each other to form block 22. No ground planes are present between the layers. FIG. 5 shows a top view of dielectric layer 28. Vias 72 and 74 are used to connect circuit features on the dielectric layers to terminals 58 and 62. The vias are metal conductors that pass through layers 24, 26 and 28. The outline of terminal portions 47, 48, 53 and 54 are shown as dashed lines in FIG. 5. The actual terminal portions 47, 48, 53 and 54 are not present on layer 28. The dashed lines represent where on layer 28 the terminal portions would overlay layer 28 if a line were drawn in the vertical direction from the end of the actual terminal portions 47, 48, 53 and 54 that are present on the top and bottom surfaces 36 and 37.

Figure 6:
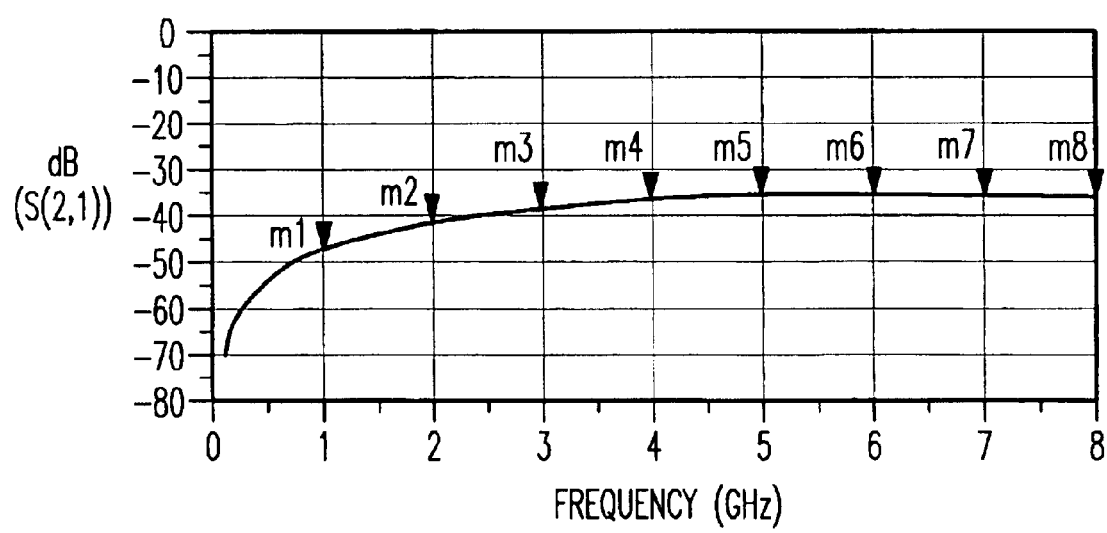
FIG. 6 is a graph of insertion loss versus frequency for the filter of FIG. 4.

The operation of filter 21 was simulated using Agilent ADS Momentum software over a frequency range of 0.1 GHz to 8.0 GHz. The simulation results are shown in FIG. 6. FIG. 6 shows a graph of insertion loss versus frequency for filter 21 between the input and output terminals. The graph of S21 shows the inherent isolation between the input and output terminals.

Block 22 can be formed from conventional high temperature ceramic materials or from low temperature co-fired ceramic materials. The vias and terminals are formed by screen printing a conventional metal conductor onto the ceramic layers. The ceramic layers are stacked and then fired to form block 22.

Figure 7:
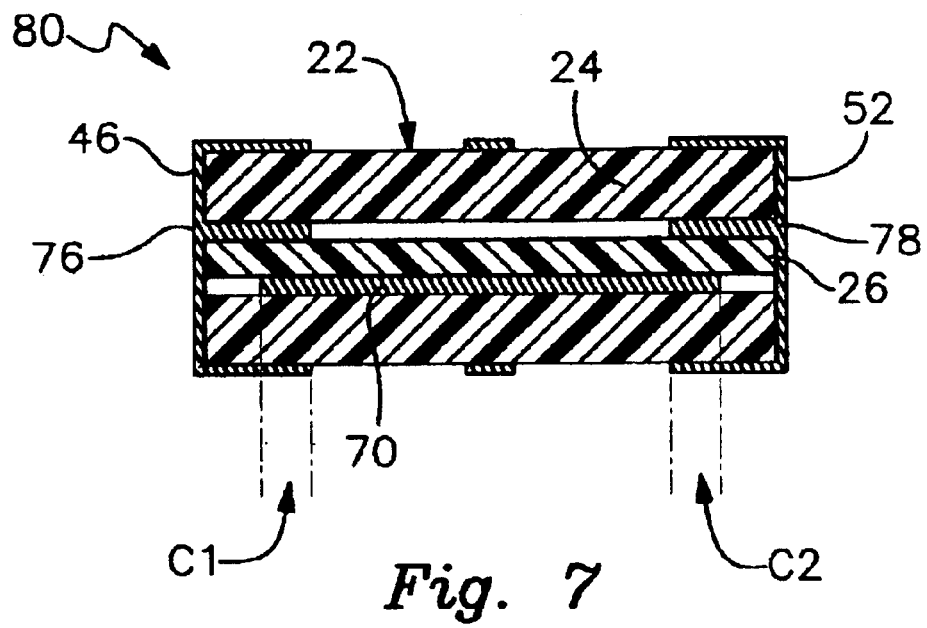
FIG. 7 is a side cross-sectional view of a filter with internal capacitors.
Figure 8:
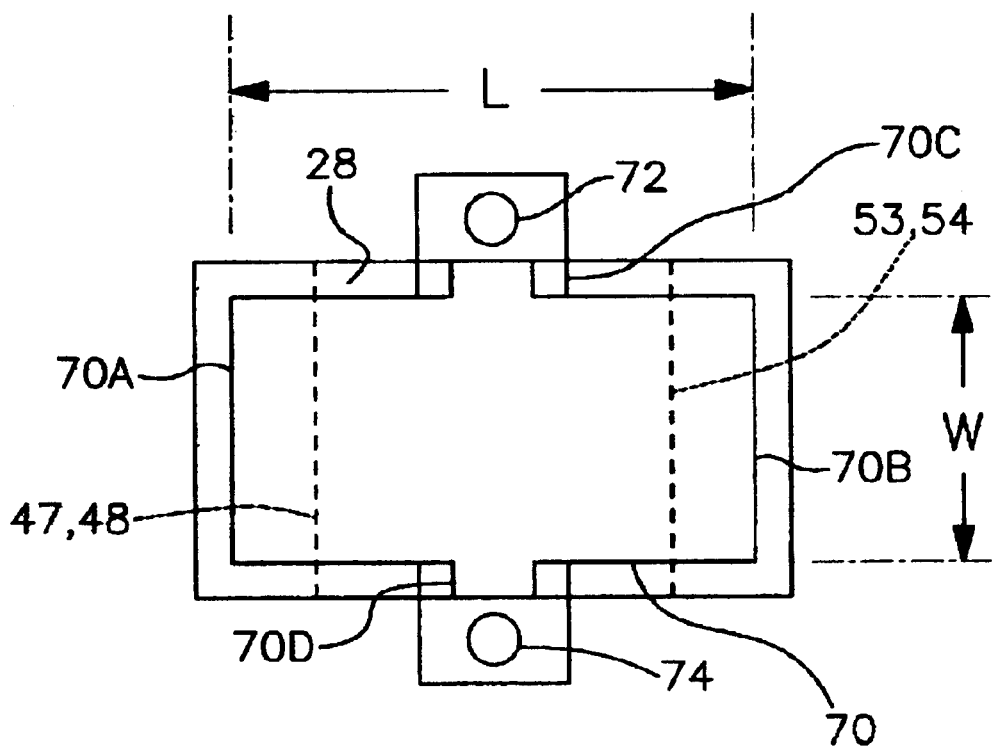
FIG. 8 is a top view of the bottom dielectric layer of FIG. 7.

Turning now to FIGS. 7 and 8, another embodiment of a filter with internal capacitors is shown. Filter 80 is similar to filter 21. In filter 80, a ground plane 70 has been added on layer 28 between layers 26 and 28. Ground plane 70 is connected to terminals 58 and 62 by vias 72 and 74. Ground plane 70 is made of a conductive metal. Ground plane 70 has a length L and width W. Ground plane 70 has ends 70A and 70B. Ground plane 70 also has extensions 70C and 70D. Extension 70C extends toward via 72 and extension 70D extends toward via 74. Terminals 58 and 62 would be connected to a source of ground potential. Metal plates 76 and 78 are located on layer 26 between layers 24 and 26. Plate 76 is electrically connected to terminal 46. Plate 78 is electrically connected to terminal 52. Plate 76 overlaps ground plane 70 with dielectric layer 26 in between to form capacitor C1. Plate 78 overlaps ground plane 70 with dielectric layer 26 in between to form capacitor C2. The capacitors are connected between the input and output ports and ground. The addition of capacitors C1 and C2 modifies the response of the filter.

Figure 9:
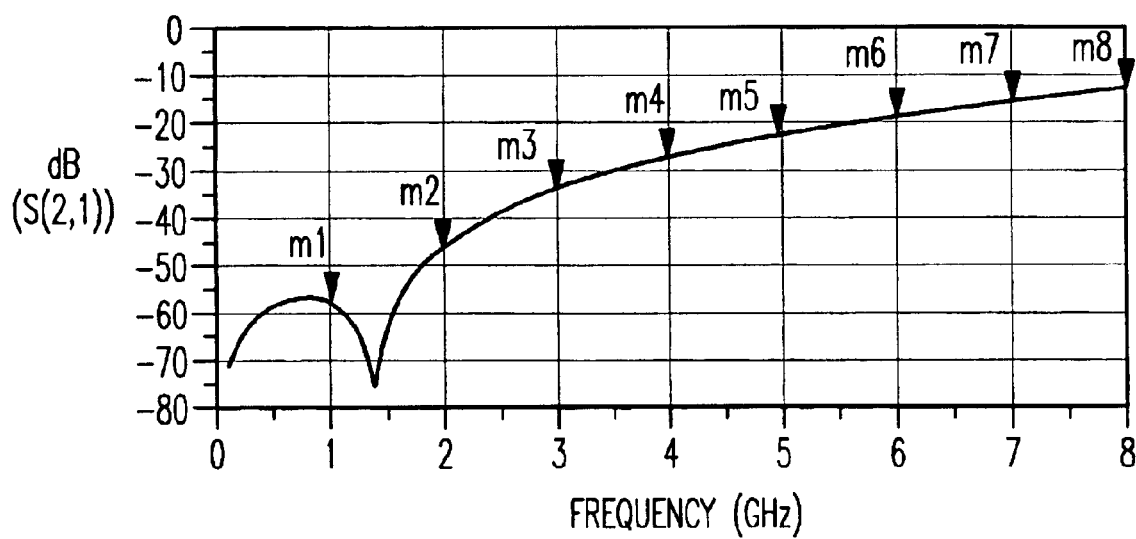
FIG. 9 is a graph of insertion loss versus frequency for the filter of FIG. 7.

FIG. 9 is a graph of insertion loss versus frequency for the filter of FIG. 7. The operation of filter 80 was simulated using Agilent ADS Momentum software over a frequency range of 0.1 GHz to 8.0 GHz. The simulation results are shown in FIG. 9. The graph shows a large degradation of isolation above 2.5 GHz.

Figure 10:
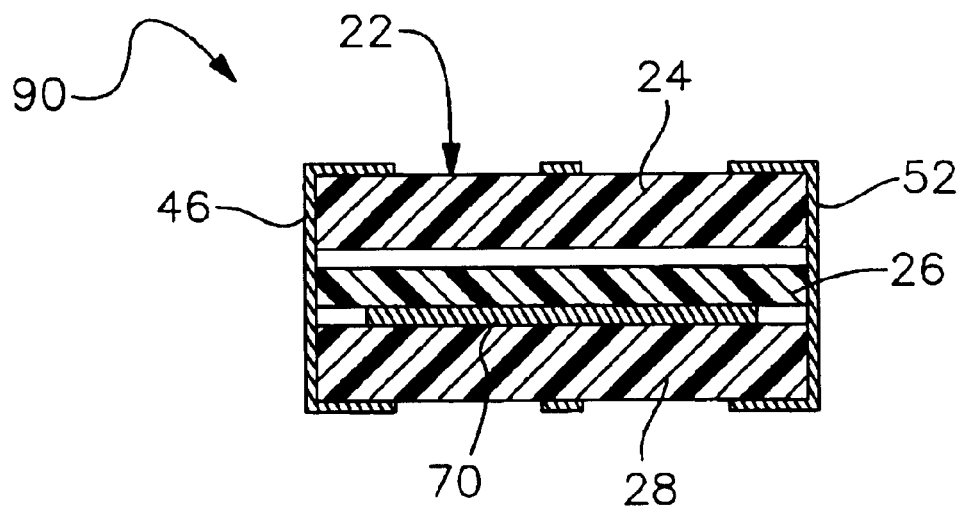
FIG. 10 is a side cross-sectional view of a filter with a full ground plane.
Figure 11:
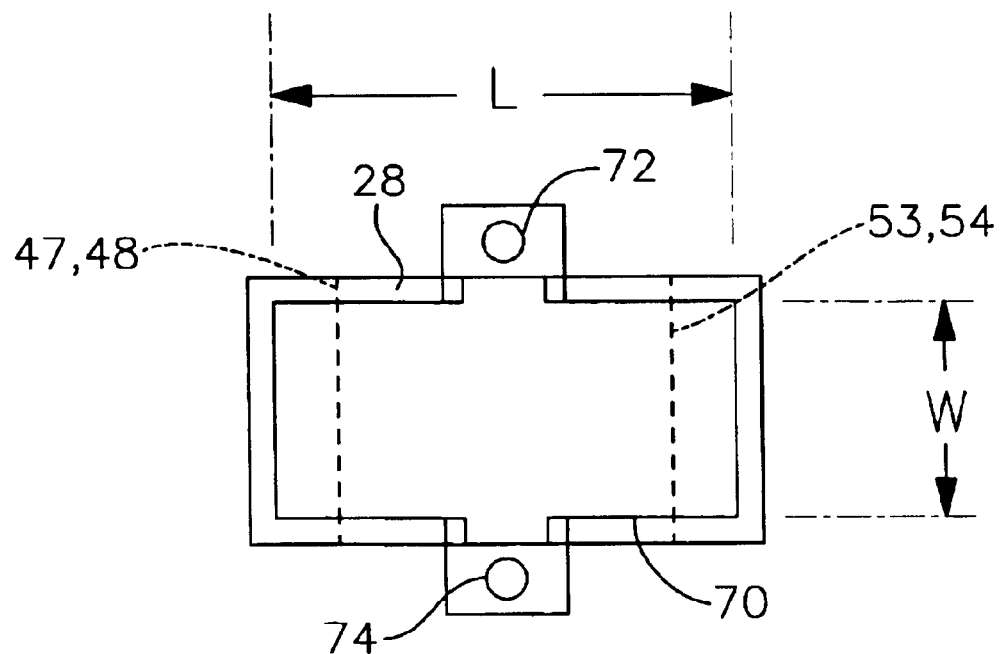
FIG. 11 is a top view of the bottom dielectric layer of FIG. 10.

Referring to FIGS. 10 and 11, another embodiment of a filter with a full internal ground plane is shown. Filter 90 is similar to filter 80 except that plates 76 and 78 have been omitted. In filter 90, ground plane 70 is present and is connected to terminals 58 and 62 by vias 72 and 74. It is noted that ground plane 70 overlaps with terminal portions 47–50 and 53–56 creating additional capacitance.

Figure 12:
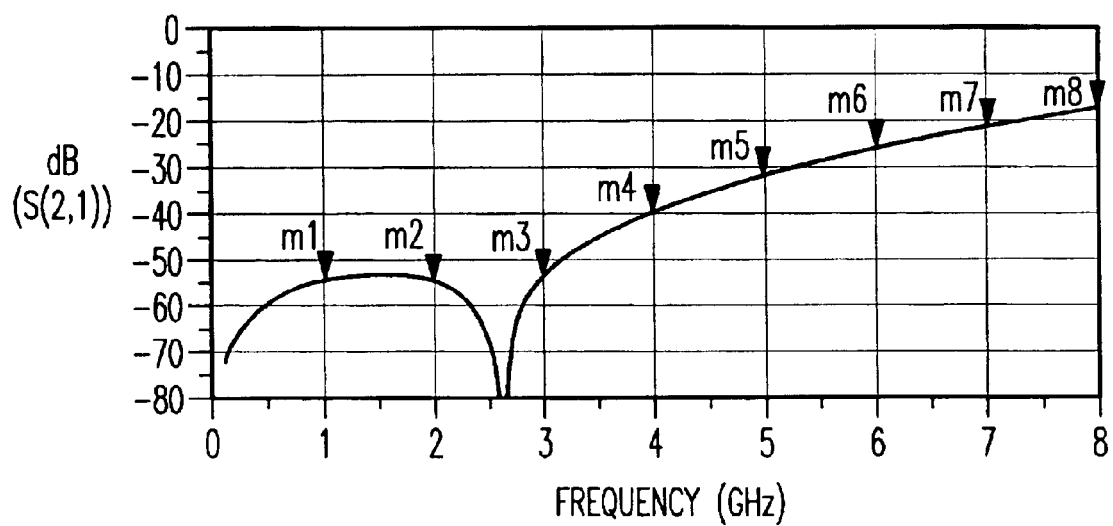
FIG. 12 is a graph of insertion loss versus frequency for the filter of FIG. 10.

FIG. 12 is a graph of insertion loss versus frequency for the filter of FIG. 10. The operation of filter 90 was simulated using Agilent ADS Momentum software over a frequency range of 0.1 GHz to 8.0 GHz. The simulation results are shown in FIG. 12. The graph shows an improvement in isolation up to 4 GHZ and a degradation of isolation above 4.0 GHz.

Figure 13:
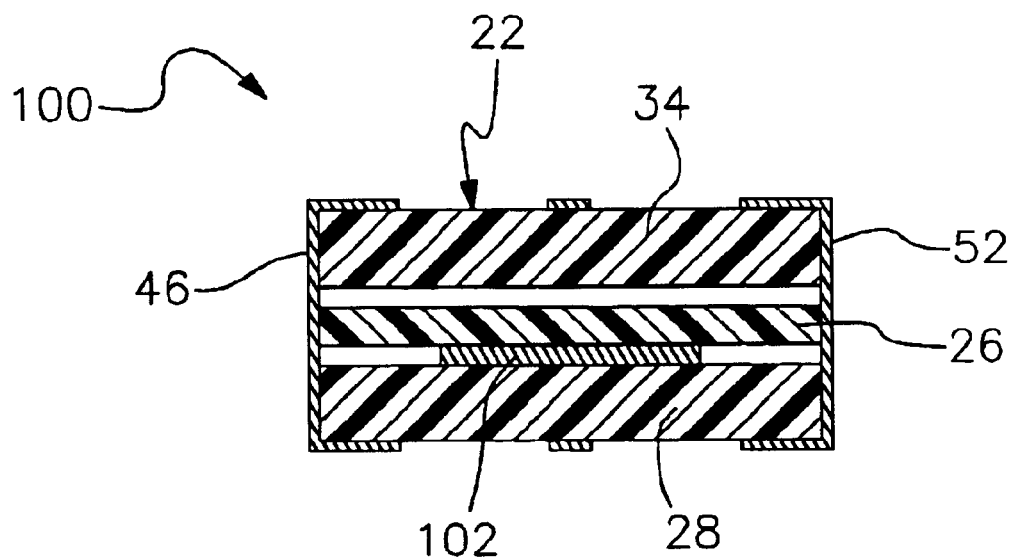
FIG. 13 is a side cross-sectional view of a filter with a partial ground plane.
Figure 14:
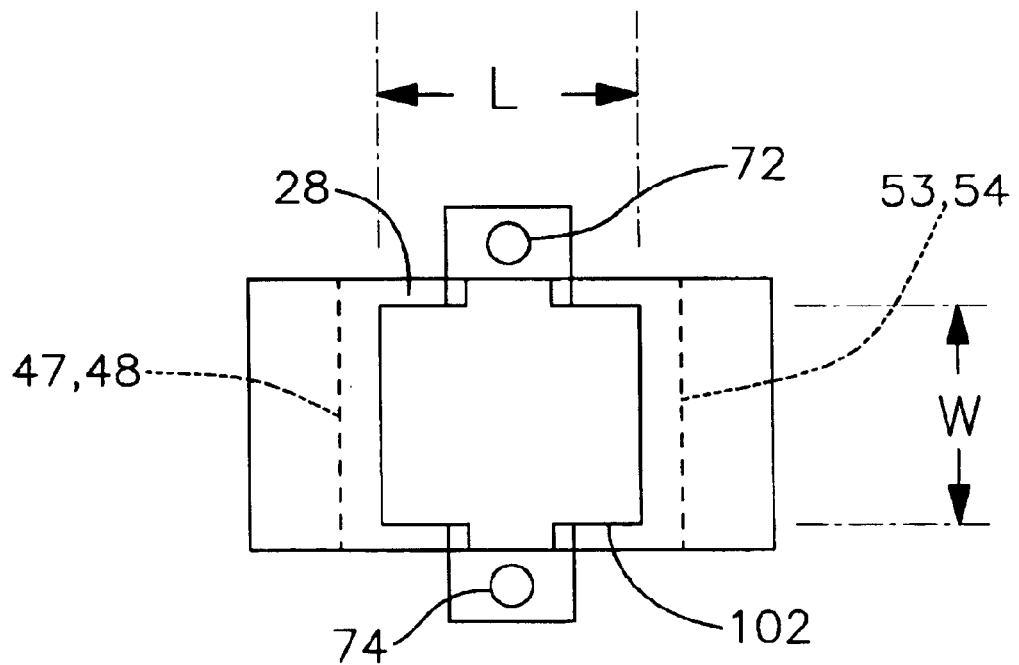
FIG. 14 is a top view of the bottom dielectric layer of FIG. 13.

Referring to FIGS. 13 and 14, another embodiment of a filter with a partial internal ground plane is shown. Filter 100 is similar to filter 90 except that the length of the ground plane has been shortened. In filter 100, ground plane 102 is located on dielectric layer 28 between layers 26 and 28 within the dielectric block 22. The ground plane is connected to terminals 58 and 62 by vias 72 and 74. Ground plane 102 extends in both directions from the center portion 34 toward but not as far as to overlap the terminal portions 47–50 and 53–56. The ground plane does not overlap either terminal 46 or 52. In other words, if an imaginary line was drawn vertically from the end of the terminal portions 47–50 or 53–56, it would not intersect the ground plane 102. Ground plane 102 therefore is a partial internal ground plane.

Figure 15:
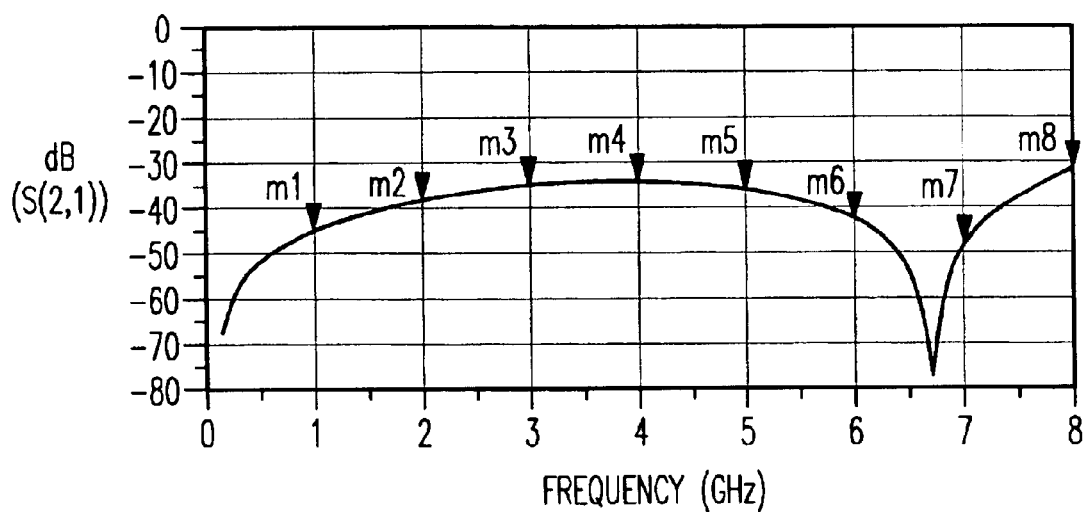
FIG. 15 is a graph of insertion loss versus frequency for the filter of FIG. 13.

FIG. 15 is a graph of insertion loss (S21) versus frequency for the filter of FIG. 13. The operation of filter 100 was simulated using Agilent ADS Momentum software over a frequency range of 0.1 GHz to 8.0 GHz. FIG. 15 shows an improvement in isolation above 0.1 GHZ as compared to the filter of FIG. 10.

Figure 16:
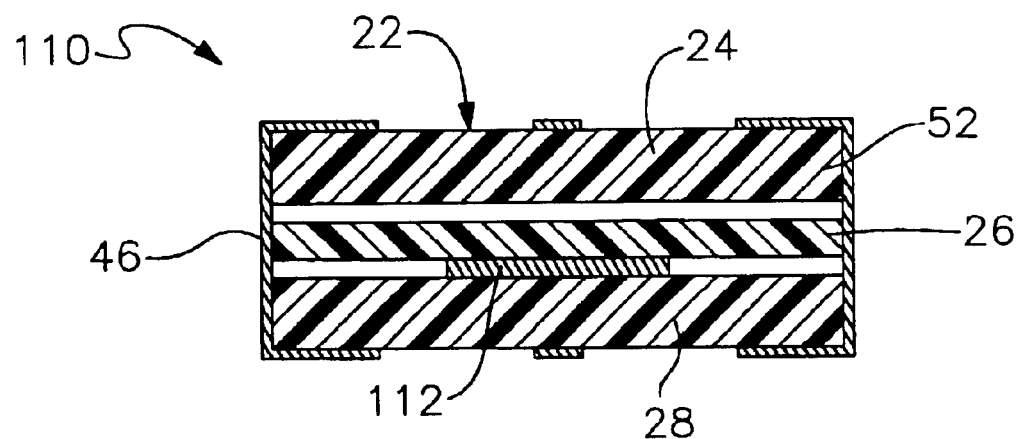
FIG. 16 is a side cross-sectional view of a filter with a partial ground plane.
Figure 17:
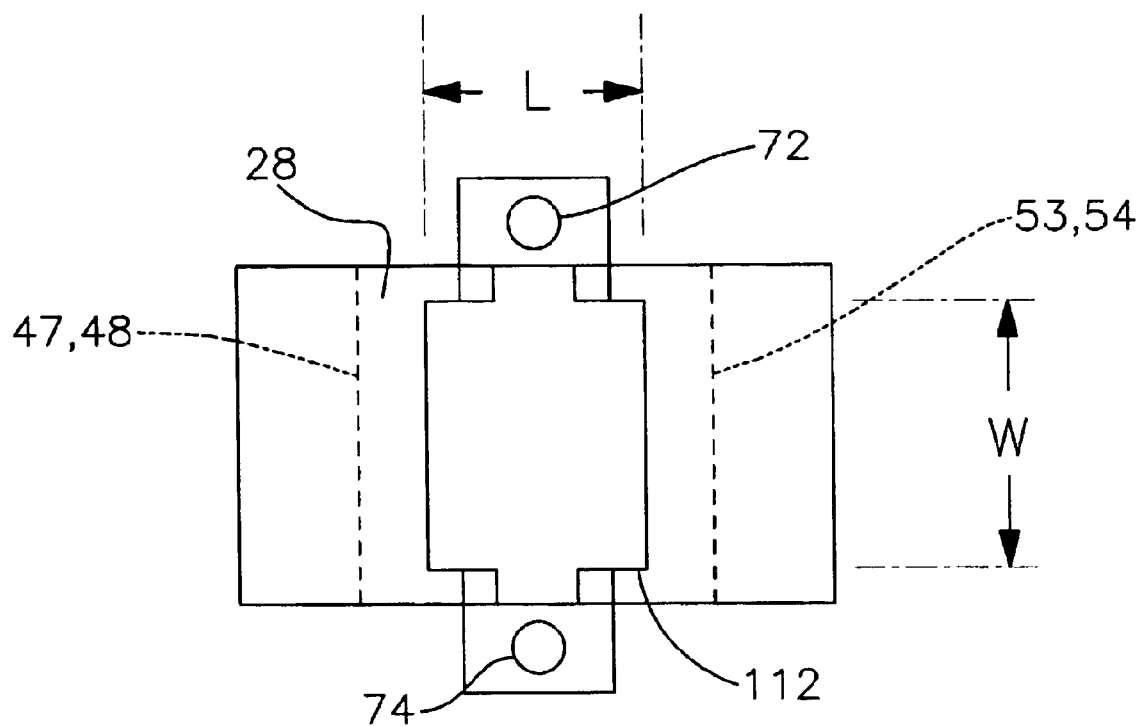
FIG. 17 is a top view of the bottom dielectric layer of FIG. 16.

Referring to FIGS. 16 and 17, another embodiment of a filter with a partial internal ground plane is shown. Filter 110 is similar to filter 100 except that the length of the ground plane has been further shortened. In filter 110, ground plane 112 is located on dielectric layer 28 between layers 26 and 28 within dielectric block 22. The ground plane is connected to terminals 58 and 62 by vias 72 and 74. Ground plane 112 extends in both directions from the center portion 34 toward but not as far as to overlap the terminal portions 47–50 and 53–56. The ground plane does not overlap either terminal 46 or 52. In other words, if an imaginary line was drawn vertically from the end of the terminal portions 47–50 or 53–56, it would not intersect ground plane 112. Ground plane 112 therefore is a partial internal ground plane.

Figure 18:
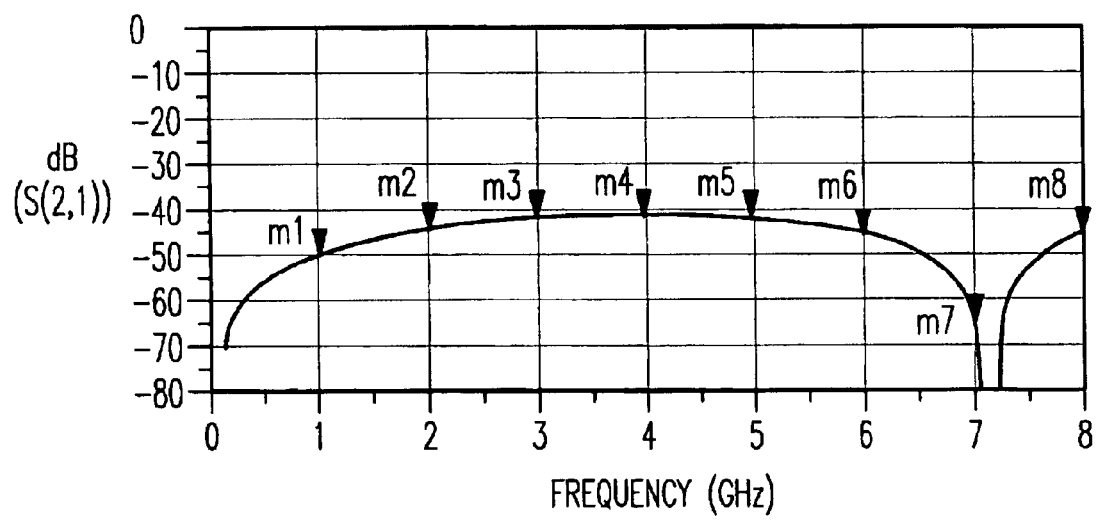
FIG. 18 is a graph of insertion loss versus frequency for the filter of FIG. 16.

FIG. 18 is a graph of insertion loss (S21) versus frequency for the filter of FIG. 16. The operation of filter 110 was simulated using Agilent ADS Momentum software over a frequency range of 0.1 GHz to 8.0 GHz. FIG. 18 shows a further improvement in isolation above 0.1 GHZ as compared to the filter of FIG. 13.

Figure 19:
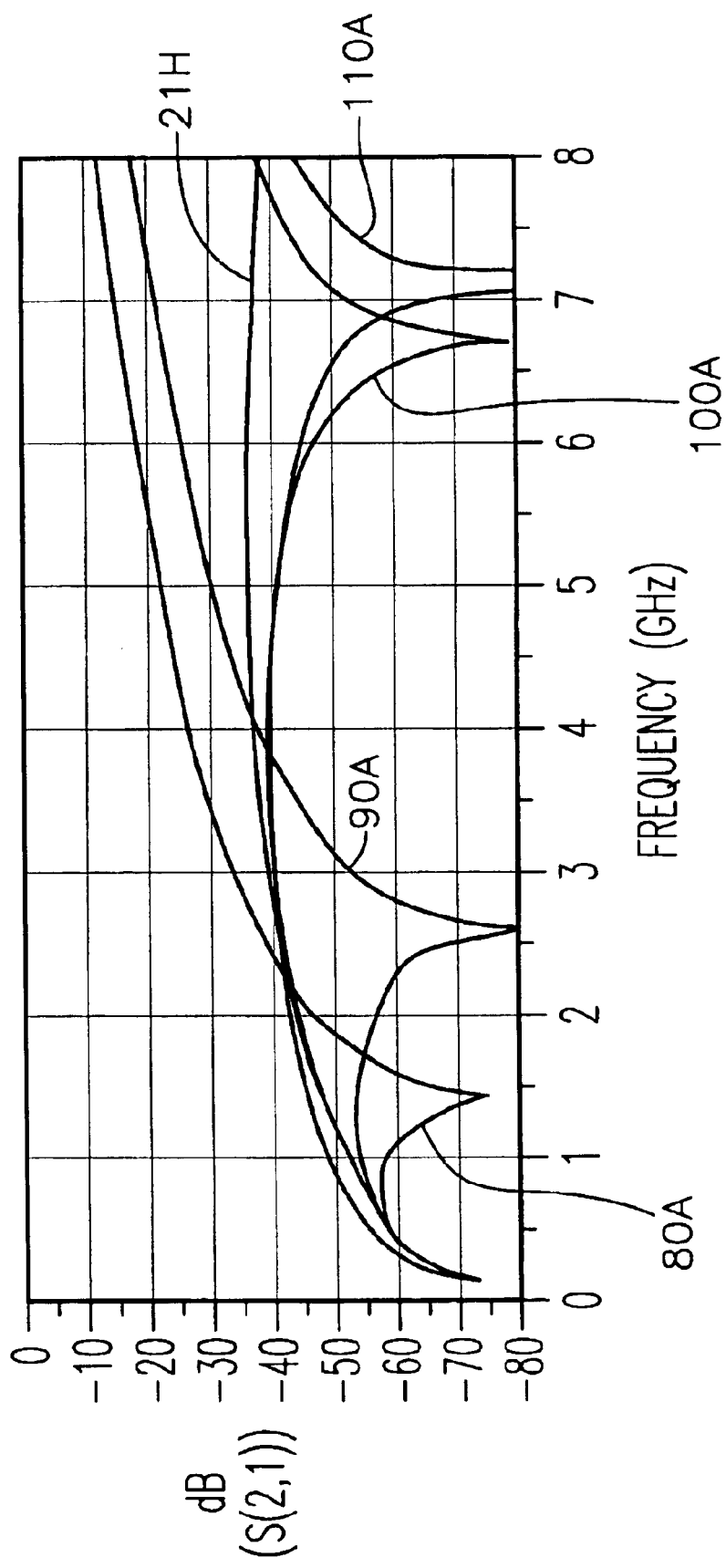
FIG. 19 is a graph comparing the insertion loss versus frequency for the filters of FIGS. 4, 7, 10, 13 and 16.

Turning now to FIG. 19, a graph comparing the isolation or insertion loss versus frequency for all the filters 21, 80, 90, 100 and 110 is shown. Line 21H shows the insertion loss for filter 20. Line 80A shows the insertion loss for filter 80. Line 90A shows the insertion loss for filter 90. Line 100A shows the insertion loss for filter 100. Line 110A shows the insertion loss for filter 110. As can be seen from line 110A, the use of the partial internal ground plane 112 greatly improves isolation between the input and output terminals. The design of ground plane 112 improved isolation over the other ground plane designs that were simulated.

The use of an internal ground plane in a filter can improve or degrade the isolation of the filter depending upon the design of the ground plane. The exact design of the ground plane is dependent upon the frequencies that are desired to be filtered. Connecting a capacitor between the input and an internal ground plane or the output port and an internal ground plane degrades the isolation of the filter.

Figure 4:
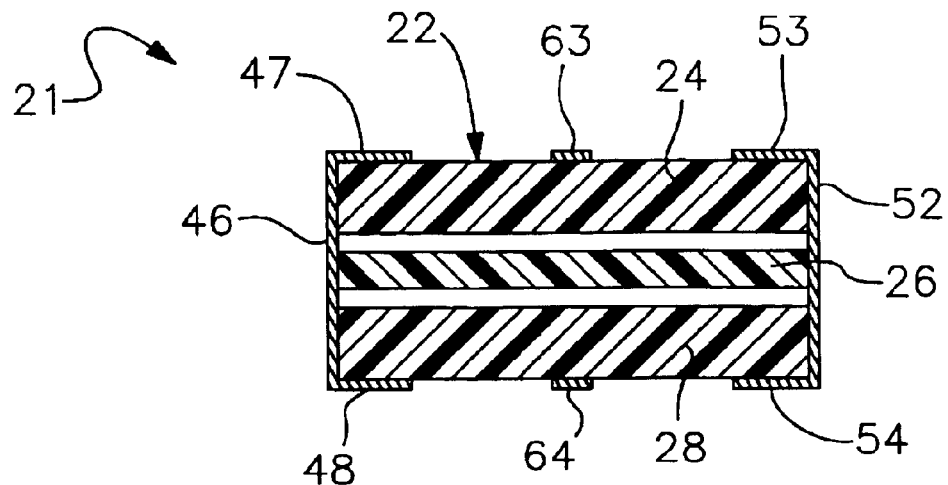
FIG. 4 is a side cross-sectional view of the filter without a ground plane.
Figure 20:
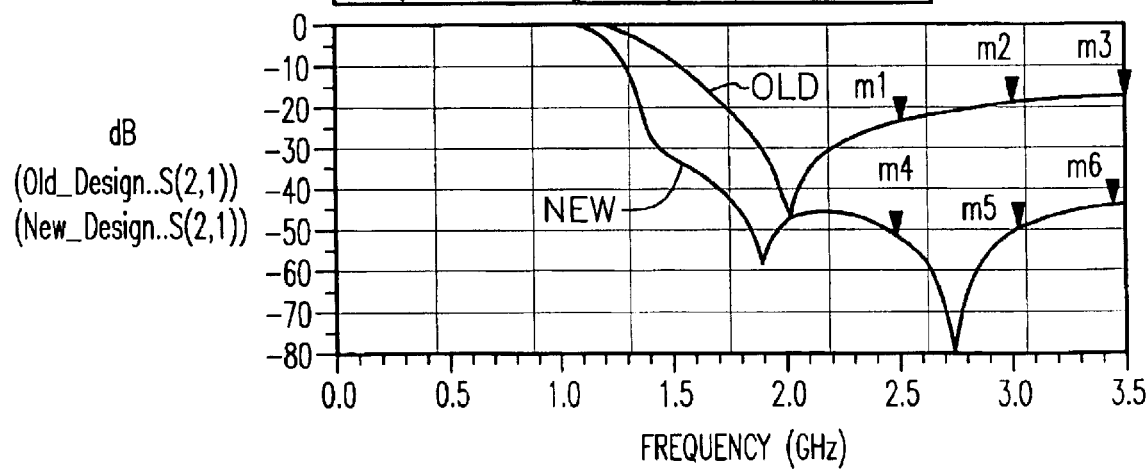
FIG. 20 is a graph comparing the insertion loss versus frequency for a low pass filter built using the layouts of FIG. 4 and FIG. 16.

Turning now to FIG. 20, a graph comparing the insertion loss versus frequency for a low pass filter built using the layouts of FIG. 4 and FIG. 16 is shown. In FIG. 20, the insertion loss for the layout of FIG. 4 is designated as line old while the insertion loss for the filter of FIG. 16 is designated as line new. As can be seen from FIG. 20, the use of the partial internal ground plane 112 greatly improves isolation in a low pass filter. The use of the partial internal ground plane improves the isolation up to −30 dB in the stop band of the filter.

While the invention was shown using a ceramic substrate, the invention can be used with other types of substrates such as FR4, Rogers 4350 and other polymeric substrates. The present invention can also be used for various mechanical shapes of filters such as cylinders, cubes and other shapes.

The present invention has several advantages. The use of a partial internal ground plane that does not overlap the terminals greatly improves isolation between the input and output ports of a filter. Another advantage of the present invention is that it has a small package size. The present invention is low in cost and is readily manufactured using existing technologies.

While the invention has been taught with specific reference to these embodiments, someone skilled in the art will recognize that changes can be made in form and detail without departing from the spirit and the scope of the invention. The described embodiments are to be considered in all respects only as illustrative and not restrictive. The scope of the invention is, therefore, indicated by the appended claims rather than by the description. All changes that come within the meaning and range of equivalency of the claims are to be embraced within their scope.

What is claimed is:

1. A filter comprising:
    a) a first ceramic dielectric layer;
    b) a second ceramic dielectric layer;
    c) a third ceramic dielectric layer, the dielectric layers stacked on each other to form a multi-layered ceramic dielectric block, the second ceramic layer being located between the first and third ceramic layers;
    d) the block having a top surface formed by the first ceramic layer and a bottom surface formed by the third ceramic layer, the block having parallel opposed first and second side surfaces and parallel opposed third and fourth side surfaces;
    e) a first terminal located on the first side surface, covering the first, second and third layers and having a first portion wrapping around onto the top surface, the bottom surface, the third side surface and the fourth side surface;
    f) a second terminal located on the second side surface, covering the first, second and third layers and having a second portion wrapping around onto the top surface, the bottom surface, the third side surface and the fourth side surface;
    g) a third terminal located on the third side surface and having a third portion wrapping around onto the top and bottom surfaces;
    h) a fourth terminal located on the fourth side surface and having a fourth portion wrapping around onto the top and bottom surfaces;
    i) a first metal plate located between the first and second ceramic dielectric layers, the first metal plate electrically connected to the first terminal;
    j) a second metal plate located between the first and second ceramic dielectric layers, the second metal plate electrically connected to the second terminal;
    k) a ground plane located within the dielectric block between the second and third ceramic dielectric layers, the ground plane having a first and second end and a first and second extension, the ground plane overlapping the first and second portions, the ground plane further overlapping the third and fourth portions, the ground plane electrically connected to the third and fourth terminals;
    l) a first capacitor being formed by the first metal plate, the second ceramic dielectric layer and the ground plane, the first metal plate overlapping the first end of the ground plane; and
    m) a second capacitor being formed by the second metal plate, the second ceramic dielectric layer and the ground plane, the second metal plate overlapping the second end of the ground plane, wherein the first and second capacitors improve isolation of the filter between the first and second terminals.

2. The filter according to claim 1, wherein a via connects the ground plane to the third and fourth terminals.

3. The filter according to claim 1, wherein the terminals are formed by screen printing a metal conductor.

4. The filter according to claim 1, wherein the first metal plate, the second metal plate and the ground plane are formed by screen printing a metal conductor.

\* \* \* \* \*